United States Patent [19]

Eaton, Jr. et al.

[11] 4,431,927
[45] Feb. 14, 1984

[54] MOS CAPACITIVE BOOTSTRAPPING TRIGGER CIRCUIT FOR A CLOCK GENERATOR

[75] Inventors: Sargent S. Eaton, Jr.; David R. Wooten, both of Colorado Springs, Colo.

[73] Assignee: Inmos Corporation, Colorado Springs, Colo.

[21] Appl. No.: 256,590

[22] Filed: Apr. 22, 1981

[51] Int. Cl.³ .................. H03K 17/12; H03K 19/096; H03K 5/135
[52] U.S. Cl. .................................... 307/269; 307/578; 307/583
[58] Field of Search .............. 307/269, 270, 482, 578, 307/DIG. 4, 262

[56] References Cited
U.S. PATENT DOCUMENTS

| | | | |
|---|---|---|---|
| 3,601,637 | 8/1971 | Spence | 307/482 X |
| 3,714,466 | 1/1973 | Spence | 307/DIG. 4 X |
| 3,778,784 | 12/1973 | Karp et al. | 307/DIG. 4 X |
| 3,889,135 | 6/1975 | Nomiya et al. | 307/482 |

*Primary Examiner*—Larry N. Anagnos
*Assistant Examiner*—David R. Hudspeth
*Attorney, Agent, or Firm*—Cook, Wetzel & Egan

[57] ABSTRACT

A trigger circuit is described for use in an MOS clock generator. The clock generator is the type which uses a conventional double bootstrapping circuit coupled to a control transistor to develop a high level clock output signal. The trigger circuit preconditions the control transistor to facilitate proper bootstrapping operation. Included in the trigger circuit is a plurality of interconnected transistors which respond to a pre-charge signal and then a warmup signal for turning the control transistor off and then for establishing selected potentials at the electrodes of the control transistor to precondition it for bootstrapping. In response to a subsequent trigger signal, the trigger circuit enables the control transistor for developing a high level clock output signal.

13 Claims, 10 Drawing Figures

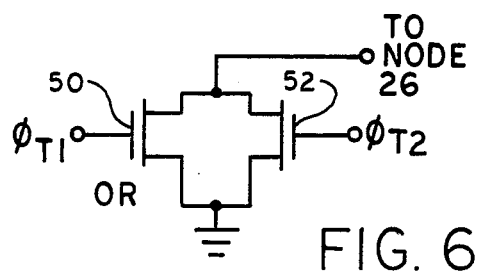
FIG. 6
FIG. 5
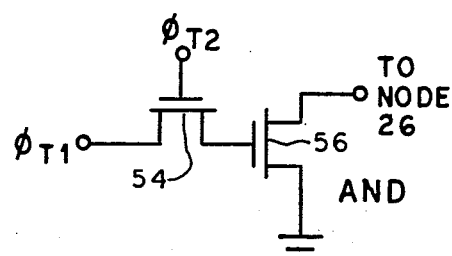
FIG. 7
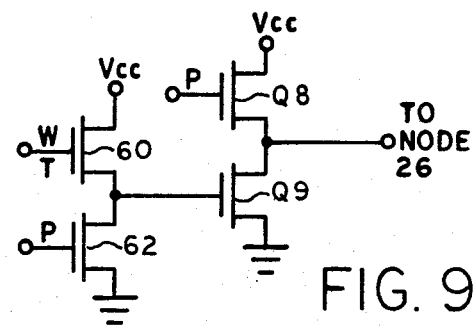
FIG. 9
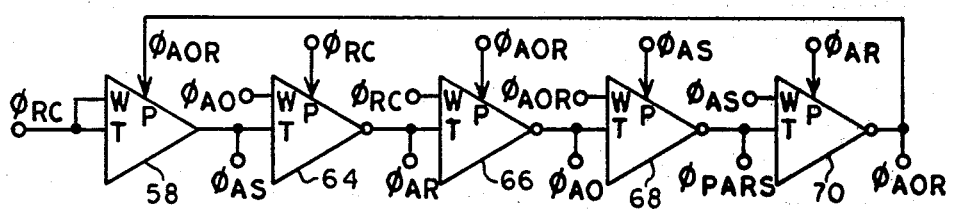
FIG. 8
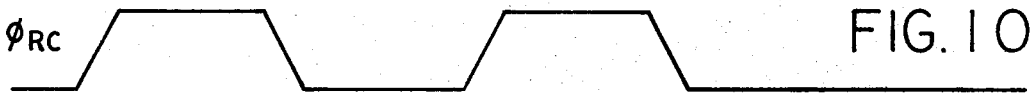
FIG. 10
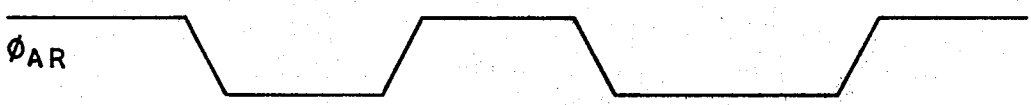

MOS CAPACITIVE BOOTSTRAPPING TRIGGER CIRCUIT FOR A CLOCK GENERATOR

BACKGROUND OF THE INVENTION

This invention is generally directed to MOS (metal oxide semiconductor) clock generators. It is particularly directed to an improved trigger circuit for use with such clock generators.

MOS memories invariably include one or more clock generators which are used to control various internal memory functions. Typically, each clock generator includes a bootstrap circuit to develop a high level clock output signal, and a pre-charge and trigger circuit to condition the bootstrap circuit for proper firing. U.S. Pat. No. 4,061,933 discloses a clock generator of this type.

Such conventional clock generators suffer from a number of problems. Their relatively high power dissipation and their relatively low gain (due to high input capacitance) are but two of their drawbacks. In addition, their clock output voltages frequently are multi-sloped. Consequently, the circuitry driven by these clock outputs must be specially designed to accommodate these characteristics.

Another problem frequently associated with conventional clock generators is that the delay associated with their outputs cannot be easily varied. Moreover, as temperature and other variables change, their delay does not track well with corresponding changes in the circuitry driven by the clock outputs.

Yet another problem with some prior clock generators is that their front end trigger circuits cannot perform logic functions (ANDing, ORing, etc.) to develop a logic controlled output without paying the penalty of increased power dissipation. The present invention overcomes this problem and the other problems mentioned above by providing an improved trigger circuit for a clock generator.

OBJECTS OF THE INVENTION

It is a general object of the invention to provide an improved trigger circuit for an MOS clock generator.

It is a more specific object of the invention to provide a trigger circuit which lowers the power dissipation and increases the gain of the clock generator.

It is another object of the invention to provide a combined trigger circuit and clock generator capable of providing a selectably variable clock delay which tracks with circuitry driven by the clock generator.

It is a further object of the invention to provide a combined trigger circuit and clock generator which is adapted to perform logic functions without increasing power dissipation.

BRIEF DESCRIPTION OF THE FIGURES

The objects stated above and other objects of the invention are set forth with more particularity in the following detailed description and in the accompanying drawings, of which:

FIG. 5 depicts waveforms of the signal inputs to the circuit of FIG. 1; FIG. 6 shows how to implement a logical OR function with the trigger circuit;

FIG. 7 shows how to implement a logical AND function with the trigger circuit;

FIG. 8 depicts a five stage clock chain, each stage of which includes the basic structure of the clock generator of FIG. 1;

FIG. 9 illustrates a modification to the trigger circuit for constructing the first stage of the clock chain in FIG. 8; and FIG. 10 shows the clock output signals developed by the clock chain of FIG. 8.

SUMMARY OF THE INVENTION

The trigger circuit described herein is for use in a clock generator which uses a conventional double bootstrapping circuit. Typically, the bootstrapping circuit responds to a trigger input by driving the drain voltage of a control transistor to a high level for use in developing a high level clock output. Before the trigger signal is received, the trigger circuit responds to a pre-charge signal and then a warmup signal to condition the voltage on the control transistor to facilitate proper bootstrapping. When the trigger signal occurs, the trigger circuit enables the voltages on the control transistor to be bootstrapped high enough to develop a full Vcc clock output.

The pre-charge circuit includes a first transistor whose source is coupled to the drain of the control transistor and whose gate is coupled to a first node. An MOS capacitor is coupled between the first node and a second node. An impedance couples the first node to a power supply voltage for charging the capacitor and for pre-charging the first node substantially to the potential of the power supply voltage. This turns on the first transistor to drive the drain of the control transistor to a pre-charged potential just below the power supply voltage.

Also included is a transistor circuit which is coupled to the second node and to the gate of the control transistor, and which receives the pre-charge signal, the warmup signal, and then the trigger signal. In response to the pre-charge signal, the transistor circuit drives the voltage at the second node low and also drives low the voltage at the gate of the control transistor to turn it off.

When the warmup signal occurs, the transistor circuit turns the control transistor on by driving its gate voltage high. In addition, the second node is driven substantially up to the potential of the power supply voltage to cause a positive voltage transition to be coupled to the first node via the capacitor. Hence, the first transistor is turned on harder to supply increased current to the drain of the control transistor. This maintains the control transistor's drain potential at least at its pre-charged potential.

In response to the trigger signal, the transistor circuit discharges the second node so that a negative voltage transition is coupled to the gate of the first transistor to turn it off as the drain of the control transistor is driven high by the bootstrapping circuit to develop the clock output.

DESCRIPTION OF THE PREFERRED EMBODIMENT

Figure 1:
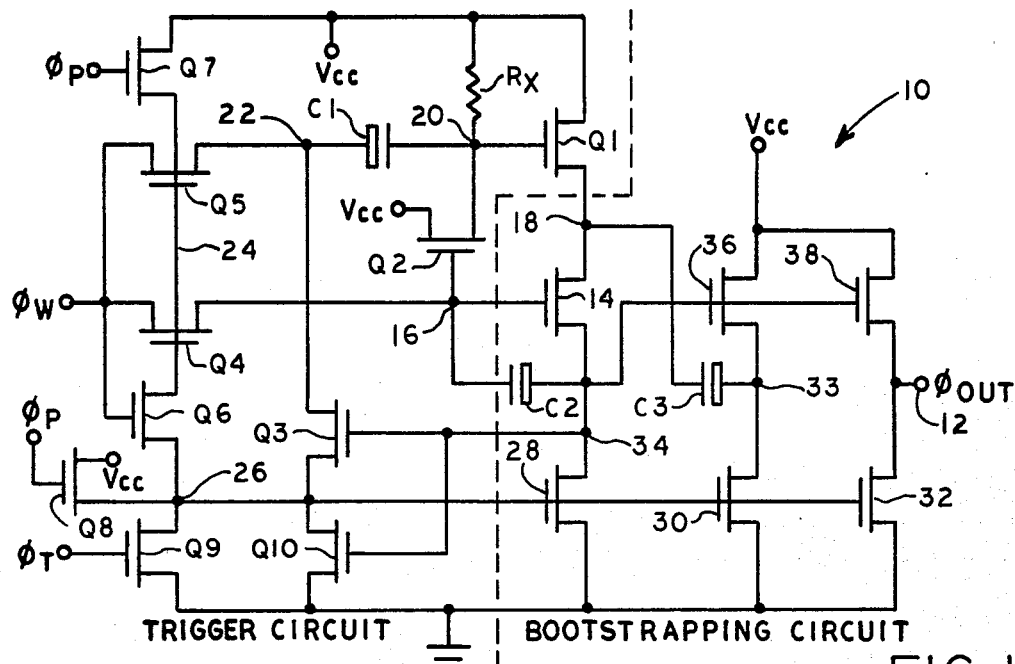
FIG. 1 shows a clock generator which includes a trigger circuit according to the invention.

Referring to FIG. 1, an MOS clock generator 10 is shown for use in developing a clock output signal (Phi out) at a terminal 12. The illustrated clock generator is shown as being divided into two parts by a dashed line. The circuitry to the right of the dashed line comprises a conventional double bootstrapping circuit which is conditioned by the circuitry to the left of the dashed line to facilitate proper bootstrapping. The circuitry to the left of the dashed line is a "trigger circuit" which is constructed in accordance with one aspect of the invention.

To facilitate the operational description which follows, certain terms used in that description will first be defined. In the bootstrapping circuit, a transistor 14 is referred to as a "control" transistor. Its gate voltage (node 16) and its drain voltage (node 18) are conditioned by the trigger circuit so that they may be bootstrapped to a relatively high voltage level for developing a high level output at terminal 12.

The trigger circuit includes a first transistor $Q_1$ whose drain receives a power supply voltage Vcc and whose source is coupled to node 18. The gate of the transistor $Q_1$ is coupled to a first node identified as node 20. Coupled between Vcc and the node 20 is an impedance Rx for charging node 20 toward Vcc. A capacitor $C_1$ is coupled between node 20 and a second node 22.

A second transistor $Q_2$ has its gate coupled to node 16, its drain coupled to Vcc, and its source coupled to node 20. As described more fully below, the function of transistor $Q_2$ is to insure proper circuit operation when variations occur in the power supply voltage.

The remainder of the trigger circuit constitutes what is referred to herein as an enabling circuit. It includes a third transistor $Q_3$, a fourth transistor $Q_4$, a fifth transistor $Q_5$, a sixth transistor $Q_6$, and a seventh transistor $Q_7$. Transistors $Q_8$ and $Q_9$ form an input circuit which is part of the enabling circuit, and transistor $Q_{10}$ is an option which may be included in circumstances described hereinafter.

Figure 2:
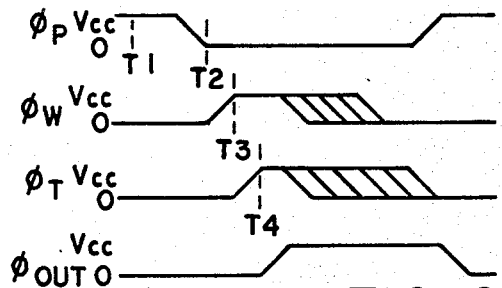
FIG. 2 shows waveforms useful in explaining the operation of the trigger circuit.

The illustrated embodiment receives three inputs, a pre-charge signal (Phi P), a warmup signal (Phi W), and a trigger signal (Phi T). The waveforms illustrating the three input signals and the output signal are shown in FIG. 2. The cross-hatched areas of the warmup and trigger signals indicate intervals during which they may go low.

The pre-charge signal is applied to the gates of transistors $Q_7$ and $Q_8$ to place the clock generator in a stable, low power state, to condition it for receipt of the warmup and trigger signals, and to reset the output signal to a low level. Pre-charging operates as follows. At time $T_1$ (FIG. 2), the pre-charge signal goes high (preferably to Vcc) while the warmup and trigger signals remain low. Consequently, transistor $Q_7$ is turned on for pre-charging a node 24 to Vcc-Vt, where Vt is the threshold voltage of the MOS devices. The transistor $Q_8$ is also turned on for pre-charging node 26 to Vcc-Vt. With the drain of $Q_6$ coupled to the gates of transistors $Q_4$ and $Q_5$, and with the drains of those transistors receiving the warmup signal which is now low, transistors $Q_4$ and $Q_5$ are turned on. Consequently, they couple a low level signal to nodes 16 and 22 to hold those nodes to essentially ground level. The low level at node 16 holds the control transistor 14 in an off condition. The high level potential on node 26 holds transistor $Q_6$ off and turns on transistors 28, 30 and 32 in the bootstrapping circuit. The drain of transistor 32 is connected to the output terminal 12 to drive it low while the drain (node 33) of transistor 30 is held low. The drain (node 34) of transistor 28 is coupled to the gate of transistors $Q_3$ and to the source of another transistor which is connected to operate as a capacitor $C_2$. With transistor 14 off and transistor 28 on, node 34 is held low to hold transistor $Q_3$ off.

The node 34 is also coupled to the gates of transistors 36 and 38 in the bootstrapping circuit. These transistors are also held off. The sources of transistors 36 and 38 are coupled to the drains of transistors 30 and 32 which are essentially nonconductive at this time.

Referring to the impedance Rx, it may be a resistor, a transistor, or a combination of circuit elements that causes the node 20 to be held at Vcc during pre-charge, and it represents a very high impedance during the interval between the warmup signal going high and the output signal going high. The reasons for these criteria are explained more fully below.

Because node 20 is at Vcc (five volts, for example) and node 22 is at ground potential, the capacitor $C_1$ is charged to Vcc, the transistor $Q_1$ is on, and the node 18 is charged to Vcc-Vt by $Q_1$. A capacitor $C_3$ which is coupled between nodes 18 and 33 is also pre-charged to Vcc-Vt. Thus, pre-charging causes the gate of transistor 14 (node 16) to be at zero volts, the drain of transistor 14 to be at Vcc-Vt volts, and capacitors $C_1$ and $C_2$ to be precharged to Vcc-Vt volts. When the pre-charge signal goes low at time $T_2$ (see FIG. 2), these pre-charge states are maintained and the clock generator is in a state of substantially zero power dissipation.

The general purpose of the warmup interval is to condition the clock generator for firing in response to the trigger signal and to take it out of its no-power, standby mode. The warmup interval may be as short as one clock delay or as long as desired.

In the present embodiment, the enabling circuit responds to the warmup signal by driving node 22 to a high level so that the capacitor $C_1$ couples a positive-going voltage transition to the node 20. This turns $Q_1$ on harder. In addition, the gate (node 16) of the control transistor 14 is driven high, substantially up to Vcc, to turn transistor 14 on. This results in an increased current drain from the node 18, but the increased conduction level of transistor $Q_1$ holds the node 18 to its pre-charged potential.

More specifically, the warmup signal going high results in transistors $Q_4$ and $Q_5$ bootstrapping node 24 above Vcc due to their gate-to-drain capacitance. Transistors $Q_4$ and $Q_5$ are turned on and couple the warmup signal to nodes 16 and 22. Hence, these nodes are now driven to Vcc. The positive voltage transition at node 22 is coupled to node 20 via capacitor $C_1$, thereby turning transistor $Q_1$ on harder. Transistor 14 now conducts because its gate is driven to Vcc. Nevertheless, the pre-charged potential at node 18 does not decrease because transistor $Q_1$ is conducting harder to supply drain current to transistor 14. Actually, the increased conduction of transistor $Q_1$ may raise the potential at node 18 above its pre-charged level of Vcc-Vt volts. In any event, maintaining the high potential at node 18 insures that the capacitor $C_3$ remains in its pre-charged state, even through transistor 14 is turned on.

Node 26 also remains at a high level because transistor $Q_6$ is turned on. Consequently, transistors 28, 30 and 32 remain on, and node 34 is held low. Transistors 36 and 38 remain off, therefore, and the output signal is held low.

To ensure that transistors 36 and 38 remain off during warmup, the transistor 28 is preferably seclected to be five to seven times larger than the transistor 14. This causes the potential at node 34 to remain below the threshold voltage of transistors 36 and 38.

The trigger circuit has now established the following warmup conditions: node 16 has been raised from ground to Vcc to turn on transistor 14; node 18 is held to its pre-charged level or higher to keep capacitor $C_3$ charged to at least Vcc-Vt; and capacitor $C_2$ has been charged to Vcc. In this state, the clock generator draws very little current, particularly since the output transistor 38 is off. The warmup condition may be maintained for a relatively long interval, if desired, before the clock generator is triggered.

The purpose of the trigger interval is, of course, to drive the output signal (Phi out) high. To do this properly, the pre-charge circuit causes nodes 22 and 16 to be isolated from the warmup signal so that node 22 can be discharged to turn off transistor $Q_1$. As described below, node 18 is bootstrapped high, and $Q_1$ being off insures that no charge is lost to Vcc through $Q_1$ as the bootstrapping takes place. Isolating node 16 enables it to be bootstrapped high also so that Phi out can be driven to Vcc.

More specifically, when the trigger signal goes high at time $T_4$, input transistor $Q_9$ turns on and discharges node 26 to ground. As node 26 goes low, transistor $Q_6$ begins turning on to discharge node 24 and turn off transistors $Q_4$ and $Q_5$. This isolates nodes 16 and 22 from the warmup signal which is now low.

Because node 26 is discharged, transistors 28, 30 and 32 begin turning off. As transistor 28 turns off, the voltage on node 34 rises. This increase in voltage is capacitively coupled to node 16 via transistor 14 and the capacitor $C_2$ to bootstrap the voltage at node 16 above Vcc. The rising voltage at node 34 also starts turning on transistors $Q_3$, 36 and 38. When transistor $Q_3$ turns on, it discharges node 22 to the potential of node 26 (zero volts). The resultant negative-going transition on node 22 is coupled to node 20 via the capacitor $C_1$. This causes the voltage at node 20 to be reduced to Vcc, and $Q_1$ is turned off.

The bootstrapped output at node 12 is developed as follows. As transistor 36 turns on, it raises the potential at node 33. The capacitor $C_3$ couples this voltage increase to node 18, thereby raising node 18 above Vcc. Because node 16 is above Vcc, the transistor 14 couples the voltage at node 18 to node 34. This further increase in voltage at node 34 is capacitively coupled to node 16, to the gate of transistor 36, and then to node 33. Feedback of higher voltage levels continues in the manner described above such that the potential at node 34 rises above Vcc plus Vt. Therefore, the source of transistor 36 rises to Vcc. Accordingly, the source of transistor 38 rises to Vcc also to develop a high level clock output signal.

One factor which causes Phi out to be driven to Vcc is that transistor $Q_1$ is held on as long as possible to supply charge to node 18. The interval during which $Q_1$ remains on is determined by the rate at which the voltages at nodes 20 and 22 fall. To control their rate of fall, the capacitance at node 22 is determined, and the size of $Q_3$ is selected so that the voltages at nodes 22 and 20 decrease to about Vcc plus Vt as the voltage at node 18 rises to Vcc.

It is desirable that node 20 lose little charge during warmup. This is achieved by selecting Rx such that the time constant defined by Rx and the capacitance on node 20 is very long with respect to the interval between the warmup signal and the trigger signal. This allows node 20 to rise above Vcc during the warmup interval and then to fall to Vcc during the trigger interval with little loss of charge. A preferred construction of Rx is described later.

The function of transistor $Q_2$ is to respond to variations in Vcc so as to ensure that transistor $Q_1$ turns off when node 18 reaches Vcc. Its operation is best explained by an example. Assume that Vcc is at six volts during the pre-charge interval, and that it then drops to four volts. Node 20 had been pre-charged to Vcc (six volts). When warmup and trigger occur, node 20 is first driven above six volts and then back down to six volts. However, because the drain of $Q_1$ receives four volts, it acts as a source. Consequently, $Q_1$ stays on and the bootstrapped charge on node 18 can be lost to Vcc through $Q_1$. $Q_2$ prevents that by forcing node 20 to Vcc when node 16 is bootstrapped one Vt above Vcc.

Figure 4:
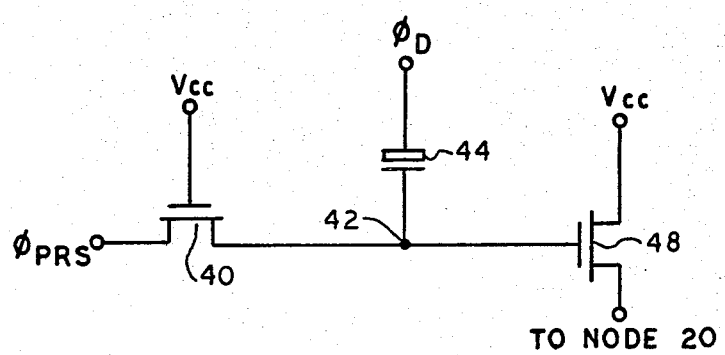
FIG. 4 illustrates a preferred embodiment of the impedance Rx of FIG. 1.

Turning now to FIG. 4, a preferred embodiment is shown of the impedance Rx. The illustrated network may receive two inputs identified as Phi PRS (pre-charge slow) and Phi D (delay). The waveforms associated with these signals are shown in FIG. 5. Included in the network is a transistor 40 whose drain receives the pre-charge signal and whose source is coupled to a central node 42. Also coupled to the node 42 is a capacitor 44 and another transistor 48. The source of transistor 48 is coupled to node 20 in FIG. 1.

The gate of transistor 40 is connected to Vcc so that, when the pre-charge signal goes high, transistor 40 drives node 42 to Vcc-Vt. To drive the node 42 to a higher voltage, the delay signal is applied to the capacitor 44. The potential at node 42 is thus raised to at least Vcc+Vt. Also, node 20 is essentially shorted to Vcc through transistor 48.

Figure 3:
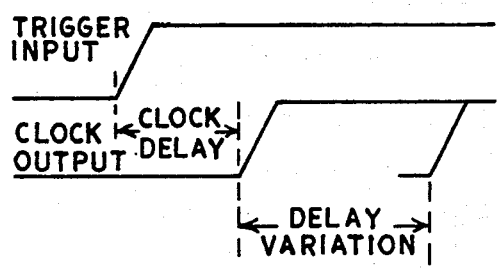
FIG. 3 illustrates the variation in clock delay provided by the trigger circuit.

One of the advantages of the illustrated embodiment (FIG. 1) is that it develops a clock output whose delay is easily varied. That delay is a function of the size of input transistor $Q_9$. When $Q_9$ is a relatively large device, it responds to the trigger signal by discharging node 26 relatively fast to develop an output which has relatively little delay. Reducing the size of $Q_9$ increases the clock delay, but does not deteriorate the rise time of the clock output. FIG. 3 illustrates the clock delay provided by the generator and the delay variation provided by changing the size of $Q_9$. If a given size of $Q_9$ provides a clock delay of 2.25 nanoseconds, reducing the size of $Q_9$ by a factor of ten increases clock delay to about 4.75 nanoseconds.

When $Q_9$ is very small, it is preferred to include the transistor $Q_{10}$. When node 26 is being pulled low, node 34 goes high to turn on transistor $Q_{10}$. The drain of this transistor is coupled to node 26 to assist in pulling it low. Where $Q_9$ is relatively large, $Q_{10}$ may be omitted.

Another advantage of the illustrated embodiment is that its clock output may be developed in response to the completion of various logic functions. For example, the input circuit may be modified by replacing transistor $Q_9$ with transistors 50 and 52, as shown in FIG. 6, to provide a logical OR function. Trigger signals Phi $T_1$ and Phi $T_2$ are coupled to the gates of transistors 50 and 52, respectively. Their drains are coupled to node 26 in FIG. 1. When either trigger signal goes high, node 26 is pulled low to develop a high level Phi out.

FIG. 7 shows how a logic AND function may be implemented. Here, transistor $Q_9$ is replaced by transistors 54 and 56. The first trigger signal is coupled to the source of transistor 54 and the second trigger signal is coupled to its gate. The drain of transistor 54 is coupled to the gate of transistor 56, and the drain of the latter transistor is coupled to node 26. When both trigger inputs go high, node 26 is pulled low to drive Phi out high.

A further advantage is that multiple generators can be easily strung together to form a clock chain. FIG. 8 shows such a chain of five clock generators for developing five synchronized clock outputs. The first stage 58 is constructed as shown in FIG. 1 with the following exception. Referring briefly to FIG. 9, transistors 60 and 62 are included to drive transistor $Q_9$. The gate of transistor 60 operates as a warmup (W) and as a trigger (T) input. The gate of transistor 62 is a precharge (P) input. Thus, when the pre-charge signal goes high, transistors 62 and $Q_8$ are turned on to pre-charge node 26. When the trigger input goes high, transistors 60 and $Q_9$ are turned on for discharging node 26 and developing Phi out.

Returning to FIG. 8, stages 64, 66, 68 and 70 follow stage 58. These stages are constructed as shown in FIG. 1 except that transistors $Q_8$ and $Q_9$ are eliminated. The output of each stage is coupled directly to node 26 in the succeeding stage. That is, the trigger (T) input of the stages 64, 66, 68 and 70 corresponds to node 26 of FIG. 1. By removing transistors $Q_8$ and $Q_9$ in these stages, they become inverting rather than non-inverting clocks. The inverting nature of stages 64–70 is indicated by the "bubble" at each of their outputs.

The illustrated clock chain is shown as receiving a single input, Phi RC at the warmup and trigger terminals of stage 58. RC may be a row address strobe or a column address strobe, for example. The outputs of the clock chain are identified by their customary notation, but they may serve whatever function is required for a particular application. FIG. 10 shows the waveforms of the five clock outputs.

Specifically, the output of stage 58, referred to as Phi AS (address strobe), is applied to the trigger input of stage 64. It also serves as the pre-charge input to stage 68.

The output of stage 64 is Phi AR (address reset) and is applied to the trigger input of stage 66. Phi AR is also applied to the pre-charge input of stage 70.

Stage 66 receives Phi RC at its warmup input and develops Phi AO (address out) at its output. That output is coupled to the trigger input of stage 68 and to the warmup input of stage 64.

The output of stage 68 is referred to as Phi PARS (pre-charge address reset slow) and is coupled to the trigger input of stage 70. The latter stage develops Phi AOR (address out reset) at its output and pre-charges stages 58 and 66 with that output. Phi AOR also serves as the warmup input for stage 68.

With this arrangement, five synchronized clock outputs are developed by using a single input. This is made possible largely by the fact that each clock stage dissipates very little power when it is in a warmup mode. Each clock stage remains in its warmup mode, dissipating little power, until it is triggered. It then reverts to a low power condition.

In addition to the trigger circuit providing reduced power dissipation, logic capability, and a selectably variable clock delay, it also provides the clock generator with high gain. This is because of the low input capacitance of the trigger circuit. Moreover, the clock generator's output is restrained from going high prematurely. High level clock output signals are developed at closely controlled times so that the circuitry receiving the clock output signals need not be specially designed.

Referring again to the delay provided by the trigger circuit, that delay tracks with corresponding changes in the circuitry receiving the clock signal. Thus, as temperature and other variables deviate from nominal, the pre-charge circuit's delay changes in a predictable, compatible manner.

Although the invention has been described in terms of preferred structure, it will be obvious to those skilled in the art that many modifications and alterations may be made to the illustrated structure without departing from the invention. Accordingly, it is intended for all such modifications and alterations be included within the spirit and scope of the invention as defined by the appended claims.

What is claimed is:

1. In an MOS clock generator which includes a bootstrapped circuit coupled to a control transistor for bootstrapping the drain voltage of the control transistor to a high level and for developing a clock output signal in response to a trigger signal, and which includes a trigger circuit to condition the gate and drain of the control transistor prior to the trigger signal to facilitate bootstrapping, an inproved trigger circuit for conditioning the control transistor in response to a pre-charge signal and then a warmup signal, and for enabling the control transistor to be bootstrapped in response to the trigger signal, comprising:

a first transistor having its source coupled to the drain of the control transistor, and having its gate coupled to a first node;

a capacitor coupled between the first node and a second node;

an impedance coupled between the first node and a power supply voltage for charging the capacitor and for pre-charging the first node substantially to the potential of the power supply voltage so that the first transistor is turned on to drive the drain of the control transistor to a pre-charged potential just below the power supply voltage; and transistor means receiving the pre-charge signal, then the warmup signal and then the trigger signal and being coupled to the second node and to the gate of the control transistor, said transistor means being:

(a) responsive to the pre-charge signal for driving the voltage at the second node low and for driving the voltage at the gate of the control transistor low to turn it off;

(b) responsive to the warmup signal for then driving the gate of the control transistor substantially up to the potential of the power supply voltage to turn it on, and for driving the second node substantially up to the potential of the power supply voltage to cause a position voltage transition to be coupled to the first node via the capacitor, so that the first transistor is turned on hard to supply increased current to the drain of the control transistor to maintain its drain potential at essentially its pre-charged potential; and (c) responsive to the trigger signal for discharging said second node such that a negative voltage transition is coupled to said first node to turn the first transistor off as the voltage at the drain of the control transistor is driven high by the bootstrapping circuit to develop a high level clock output signal.

2. A trigger circuit as set forth in claim 1 wherein said impedance is selected such that the time constant associated with the impedance and the capacitor at the first node is relatively high in comparison with the interval between the warmup signal and the trigger signal.

3. A trigger circuit as set forth in claim 2 wherein said impedance includes:
- a transistor whose drain receives a pre-charge signal and whose source is coupled to a central node for driving the central node toward the power supply potential;
- a capacitor having one terminal for receiving a delayed pre-charge signal and another terminal coupled to said central node for driving the potential at the central node above the power supply potential; and
- an output transistor responsive to the potential at the central node for coupling the power supply potential to the first node.

4. A trigger circuit as set forth in claim 1 further including a second transistor having its gate coupled to the gate of the control transistor, having its drain coupled to the power supply voltage, and having its source coupled to said first node, whereby the voltage at said first node is caused to track with variations in the power supply voltage.

5. A trigger circuit as set forth in claim 1 wherein said transistor means includes a third transistor whose drain is coupled to said second node and whose gate is responsive to the pre-charge signal for driving low the voltage at the second node.

6. A trigger circuit as set forth in claim 5 wherein said transistor means further includes a fourth transistor whose drain receives the warmup signal, whose source is coupled to the gate of the control transistor, and whose gate is coupled to the pre-charge signal, and a fifth transistor whose drain receives the warmup signal, whose source is coupled to said second node and whose gate is coupled to the pre-charge signal so that, when the pre-charge signal is high and the warmup signal is low, the fourth and fifth transistors are turned on for coupling the low level warmup signal to the second node and to the gate of the control transistor.

7. A trigger circuit as set forth in claim 6 wherein said transistor means includes a sixth transistor having its drain coupled to the gates of the fourth and fifth transistors and being responsive to the trigger signal going high for turning off the fourth and fifth transistors to isolate the second node and the gate of the control transistor.

8. A trigger circuit as set forth in claim 7 wherein said transistor means includes an input circuit for coupling the trigger signal to said third transistor such that, when the trigger signal goes high, the third transistor discharges the isolated second node and the capacitor drives the first node low to turn off the first transistor.

9. A trigger circuit as set forth in claim 1 wherein the clock generator is characterized by receiving a plurality of trigger signals, and wherein said transistor means includes an input circuit responsive to a predetermined logical combination of trigger signals for discharging said second node.

10. A trigger circuit as set forth in claim 1 wherein said transistor means includes an input circuit for receiving the trigger signal, and wherein said input circuit is characterized by selectably delaying the effect of the trigger signal.

11. In an MOS clock generator having a plurality of stages for developing a plurality of clock output signals, and wherein each such stage includes a bootstrapping circuit coupled to a control transistor for bootstrapping the drain voltage of the control transistor to a high level and for developing a clock output signal in response to a trigger signal, and wherein each such stage includes a trigger circuit to condition the control transistor prior to the trigger signal to facilitate bootstrapping, an improved trigger circuit for conditioning the control transistor in response to a pre-charge signal and then a warmup signal, and for enabling the control transistor to be bootstrapped in response to the trigger signal, comprising:
- a first transistor having its source coupled to the drain of the control transistor, and having its gate coupled to a first node;
- a capacitor coupled between the first node and a second node;
- an impedance coupled between the first node and a power supply voltage for charging the capacitor and for pre-charging the first node substantially to the potential of the power supply voltage so that the first transistor is turned on to drive the drain of the control transistor to a pre-charged potential just below the power supply voltage;
- transistor means having a trigger input, a warmup input, and a pre-charge input, and being coupled to the second node and to the gate of the control transistor, said transistor means being:
  - (a) responsive to the pre-charge signal for driving the voltage at the second node low and for turning off the control transistor; and
  - (b) responsive to the warmup and trigger signals for turning on the control transistor, for increasing the voltage at the second node to turn the first transistor on harder to supply increased current to the drain of the control transistor, and for then turning off the first transistor as the voltage at the drain of the control transistor is driven high by the bootstrapping circuit.

12. A trigger network as set forth in claim 11 wherein the trigger signal input to each stage following a first stage constitutes the clock signal output of an immediately preceding stage.

13. A trigger network as set forth in claim 12 wherein the clock generator includes five consecutive stages for developing five clock output signals, wherein the first stage receives the trigger signal at its trigger input and the fifth clock signal at its pre-charge input, wherein the second stage receives the first clock signal at its trigger input, the third clock signal at its warmup input and the trigger signal at its pre-charge input, wherein the third stage receives the second clock signal at its trigger input, the trigger signal at its warmup input and the fifth clock signal at its pre-charge input, wherein the fourth stage receives the third clock signal at its trigger input, the fifth clock signal at its warmup input and the first clock signal at its pre-charge input, and wherein the fifth stage receives the fourth clock signal at its trigger input, the first clock signal at its warmup input and the second clock input at its pre-charge input.

* * * * *